US010663434B2

(12) United States Patent
Wright

(10) Patent No.: US 10,663,434 B2
(45) Date of Patent: May 26, 2020

(54) WAFER CHUCK

(71) Applicant: SONIX, Inc., Springfield, VA (US)

(72) Inventor: Michael Lemley Wright, Fredericksburg, VA (US)

(73) Assignee: SONIX, Inc., Springfiled, VA (US)

( * ) Notice: Subject to any disclaimer, the term of this patent is extended or adjusted under 35 U.S.C. 154(b) by 313 days.

(21) Appl. No.: 15/637,044

(22) Filed: Jun. 29, 2017

(65) Prior Publication Data

US 2018/0284071 A1  Oct. 4, 2018

Related U.S. Application Data

(60) Provisional application No. 62/479,464, filed on Mar. 31, 2017.

(51) Int. Cl.
| | |
|---|---|
| *B25B 11/00* | (2006.01) |
| *G01N 29/22* | (2006.01) |
| *G01N 29/06* | (2006.01) |
| *H01L 21/67* | (2006.01) |
| *H01L 21/683* | (2006.01) |

(52) U.S. Cl.
CPC ......... *G01N 29/223* (2013.01); *G01N 29/069* (2013.01); *H01L 21/67288* (2013.01); *H01L 21/6838* (2013.01); *G01N 2291/0231* (2013.01)

(58) Field of Classification Search
USPC ............... 269/20, 21; 451/41, 285, 289, 301
See application file for complete search history.

(56) References Cited

U.S. PATENT DOCUMENTS

| | | | |
|---|---|---|---|
| 7,292,427 B1 | 11/2007 | Murdoch et al. | |
| 8,181,688 B2* | 5/2012 | Johnson | ............ H01L 21/67092 156/711 |
| 9,576,827 B2* | 2/2017 | Liu | .......... H01L 25/50 |
| 9,960,070 B2* | 5/2018 | Huang | .................. B25B 11/005 |
| 2003/0156270 A1* | 8/2003 | Hunter | .................... G03F 7/707 355/72 |
| 2005/0011460 A1* | 1/2005 | Taniguchi | ........... H01L 21/6838 118/728 |

FOREIGN PATENT DOCUMENTS

| | | |
|---|---|---|
| JP | H03 270048 | 12/1991 |
| JP | H04 64216 | 2/1992 |

* cited by examiner

*Primary Examiner* — Joseph J Hail
*Assistant Examiner* — Shantese L Mcdonald
(74) *Attorney, Agent, or Firm* — Leveque IP Law, P.C.; Andrew J. Harrington

(57) ABSTRACT

A wafer chuck includes a support structure having a first side structurally configured to support a wafer, and a vacuum zone formed on the first side of the support structure. The vacuum zone may be at least partially bounded by a ring extending from a recessed surface of the first side of the support structure. The wafer chuck further includes a plurality of suction cups disposed in the vacuum zone, where one or more of the plurality of suction cups is coupled with a channel extending through the support structure. One or more vacuums are in fluid communication with the channel, where a vacuum is structurally configured to provide suction through the channel.

24 Claims, 8 Drawing Sheets

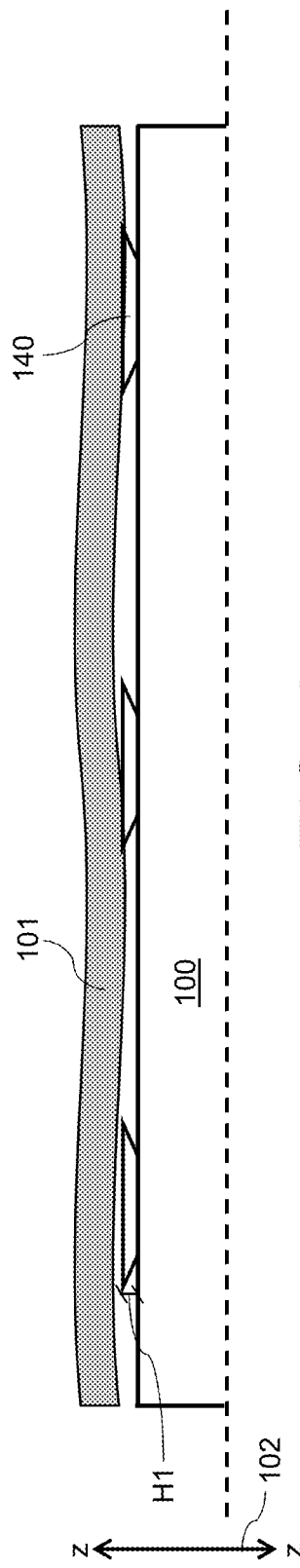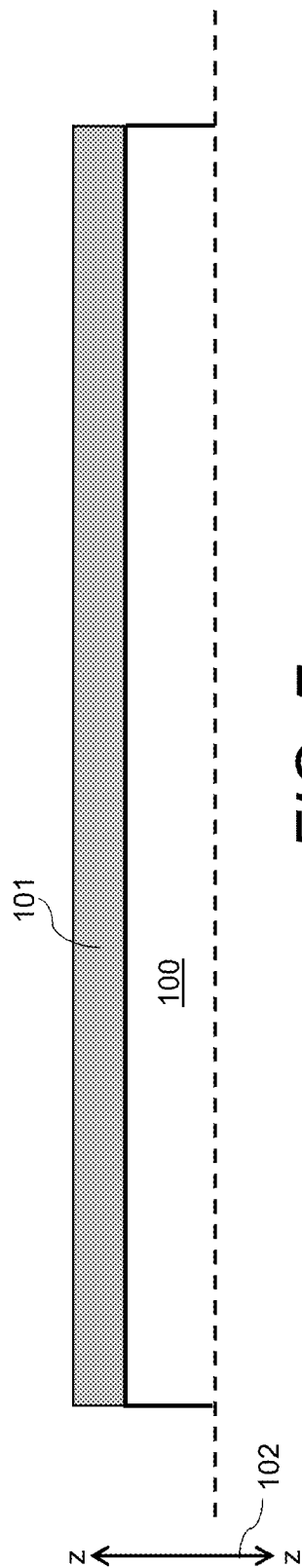

WAFER CHUCK

CROSS-REFERENCE TO RELATED APPLICATIONS

This application claims the benefit of U.S. Provisional Patent Application No. 62/479,464 filed on Mar. 31, 2017, the entire content of which is hereby incorporated by reference.

BACKGROUND

Scanning acoustic microscopes may be used to nondestructively inspect bonded wafer pairs in the semiconductor industry, e.g., for air type defects in the interior of the bonded wafer pair, which can occur at internal interfaces. However, inspecting a warped bonded wafer pair can present challenges in such inspections. Some semiconductor products in particular may result in bonded wafer pairs that are prone to warping, such as back-side-illuminated (BSI or BI) sensors, complementary metal-oxide-semiconductor (CMOS) products, and micro-electro-mechanical systems (MEMS) sensors, among others. This may be due to differences in the coefficients of thermal expansion (CTE) of the material layers in the bonded wafer pairs present in these semiconductor products. In the past, bonded wafers were usually level or flat to within about 300 µm, but recently bonded wafers often include warpage of up to about 5-6 mm. As the wafer bonding process is finalized, warpage may be reduced to about 1-2 mm, but nevertheless this warpage can still present issues for inspection using scanning acoustic microscopes and the like.

Before being ultrasonically inspected, a bonded wafer pair may be placed on a wafer chuck to secure the bonded wafer pair during scanning, e.g., at speeds that can reach about 1.5 m/s. The wafer chuck may incorporate a form of vacuum to hold the bonded wafer pair in place, e.g., by including various vacuum rings for supporting and forming a vacuum seal with different sized wafers.

Wafer chucks of the prior art may assume that the bonded wafer pair to be inspected will be sufficiently flat in order to create a proper vacuum seal, which may be needed to hold the bonded wafer pair in place. That is, as long as a sufficient vacuum seal can be formed, minimal warpage (e.g., less than or equal to about 300 µm) may be reduced even further depending on the materials and thicknesses used for the bonded wafer pair. However, many contemporary bonded wafer products (such as those recited above) include too much warpage for the wafer to form a sufficient vacuum seal on a prior art wafer chuck for inspection with a scanning acoustic microscope. To this end, in the prior art, techniques to provide a sufficient seal may include pressing down on the wafer, either by hand or using a mechanical mechanism that can potentially damage a bonded wafer product. Thus, there remains a need for improved wafer chucks, e.g., to support and secure warped bonded wafer pairs for inspection with a scanning acoustic microscope.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. The drawings are not necessarily to scale, emphasis instead being placed upon illustrating the principles of the devices, systems, and methods described herein. In these drawings, like reference numerals may identify corresponding elements.

FIG. 6 illustrates a side view of a wafer chuck holding a warped wafer before suction is applied, in accordance with a representative embodiment.

FIG. 7 illustrates a side view of a wafer chuck holding a wafer when suction is applied, in accordance with a representative embodiment.

DETAILED DESCRIPTION

Figure 1:
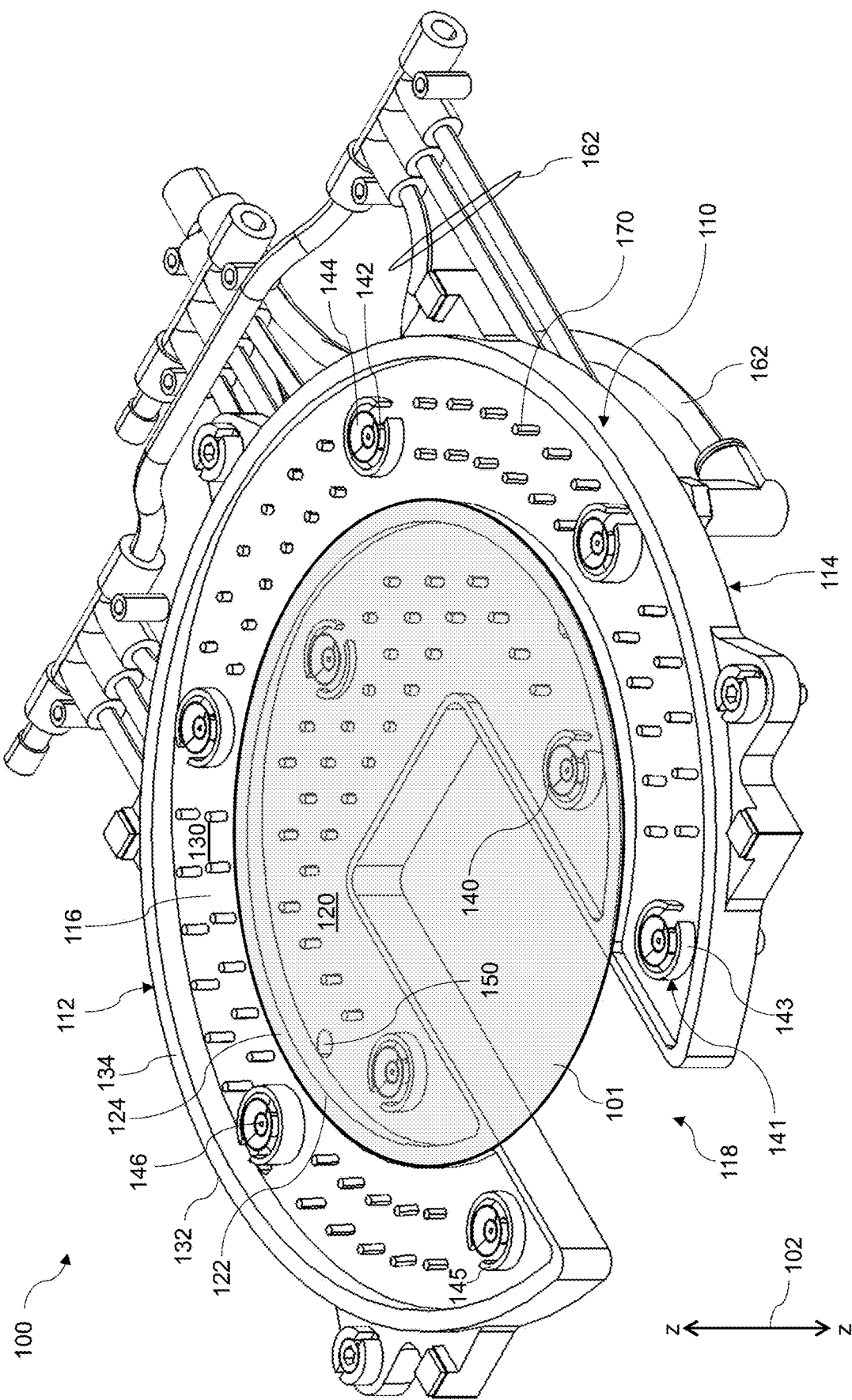
FIG. 1 is a top perspective view of a wafer chuck, in accordance with a representative embodiment.

The various methods, systems, apparatuses, and devices described herein may generally include securing and supporting warped bonded wafer pairs for inspection with a scanning acoustic microscope, e.g., using a wafer chuck as disclosed herein.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

In general, the devices, systems, and methods described herein may be configured for, and may include, a wafer chuck to support a wafer, e.g., for inspection with a scanning acoustic microscope or the like.

A "wafer" as described herein may include a bonded wafer pair as known in the semiconductor industry, e.g., for use in one or more of microelectromechanical systems (MEMS), nanoelectromechanical systems (NEMS), microelectronics and optoelectronics, complementary metal-oxide-semiconductor (CMOS) systems, and the like. A wafer, as used throughout this disclosure, may thus include one or more relatively thin slices of semiconductor material, such as a crystalline silicon, e.g., for use in electronics for the fabrication of integrated circuits, in photovoltaics for wafer-based solar cells, among other uses. The wafer may serve as the substrate for microelectronic devices built in and over the wafer, where the wafer may undergo a plurality of microfabrication processing steps such as doping or ion implantation, etching, deposition of various materials, photolithographic patterning, and the like. As discussed herein, the wafer may be bonded to provide a relatively mechanically stable and hermetically sealed encapsulation of microelectronics—as such, the wafer as described herein and used throughout this disclosure may include a bonded wafer pair, which may be formed by any technique in the art such as direct bonding, surface activated bonding, plasma activated bonding, anodic bonding, eutectic bonding, glass frit bonding, adhesive bonding, thermocompression bonding, reactive bonding, transient liquid phase diffusion bonding, and so forth.

The wafer as described herein and used throughout this disclosure may also or instead include a "warped" wafer, as well as an "unwarped" wafer. An unwarped wafer may include any wafer having warpage of less than or equal to about 300 µm across one or more of the surfaces of the wafer, i.e., as measured relative to a plane to which a surface of the wafer is substantially conformant, or as measured relative to an axis or centerline of the wafer. Conversely, a warped wafer as described herein may include any wafer having warpage greater than about 300 µm. In some instances, a warped wafer may include warpage of as much as about 1-6 mm. By way of example, warped wafers may be found in bonded wafer pairs as a result of differences in the coefficients of thermal expansion (CTE) of the material layers present in such bonded wafer pairs. This may be particularly prevalent in certain semiconductor products such as back-side-illuminated (BSI or BI) sensors, complementary CMOS products, MEMS sensors, and the like.

The wafer may include various sizes and shapes, and it will be understood that the wafer is not limited to a particular size, shape, thickness, weight, geometry, material, or other property. For example, bonded wafer pairs may typically come in five to six standard sizes, namely 2-inch, 4-inch, 5-inch, 6-inch, 8-inch, and 12-inch wafers, with 6-inch, 8-inch, and 12-inch wafers being the most common. Thus, the wafer may include one or more of these "standard" sizes, or the wafer may have a different size.

A "wafer chuck" as described herein and used throughout this disclosure may include a device, system, or apparatus structurally configured to support, stabilize, hold, or otherwise secure a wafer, e.g., for inspection using a scanning acoustic microscope or the like. Also, any reference to one of supporting, stabilizing, holding, securing, and similar terms when discussing the wafer chuck, will be understood to include any and all such terms unless explicitly stated to the contrary or otherwise clear from the context.

In general, the devices, systems, and methods described herein may include or otherwise utilize a wafer chuck that can pull (or otherwise manipulate) warped wafers such that they are substantially flat or unwarped. As discussed above, being "substantially flat" or "substantially unwarped" may include having warpage of less than or equal to about 300 µm across one or more of the surfaces of the wafer. Thus, a wafer chuck according to the present teachings may be structurally configured to pull a warped wafer such that it becomes unwarped when disposed and secured on the wafer chuck, which may be advantageous for inspection with a scanning acoustic microscope or the like. In some instances, the wafer chuck pulling the wafer flat may maintain the flatness of the wafer even after inspection.

In general, a wafer chuck according to the present teachings may include different regions for different wafer sizes and shapes, e.g., two or more regions or zones for different wafer diameters, which may be bounded by one or more rings corresponding to the different wafer diameters. The wafer chuck may include one or more vacuum holes in each of the regions or zones contained therein, as well as a plurality of suction cups in each of the regions or zones. The suction cups may stick up above other areas and structures of the wafer chuck such that, when a warped wafer is placed onto the wafer chuck, the wafer initially rests on the suction cups, which then compress and allow for different warped areas of the wafer to be in contact with the suction cups at the same time. To further accommodate this process, the suction cups may be coupled with channels in fluid communication with a vacuum, e.g., where suction is applied through the channels for pulling the warped wafer against the suction cups. In this manner, when a vacuum is applied through the suction cups, the suction cups pull the wafer such that it rests substantially flat against support posts or the like, e.g., where the support posts are disposed at the same height as the rings that bound the regions or zones included on the wafer chuck. Further, suction may additionally be supplied to the appropriate regions or zones included on the wafer chuck through vacuum holes disposed therein to further aid in pulling the wafer down against the support posts and securing the wafer to the wafer chuck for inspection. Essentially, the suction cups may pull on different portions of a warped wafer until the wafer makes contact with a ring or other zone boundary, and then suction applied through vacuum holes may continue to pull the wafer such that it is substantially flat and secured against the wafer chuck.

Figure 2:
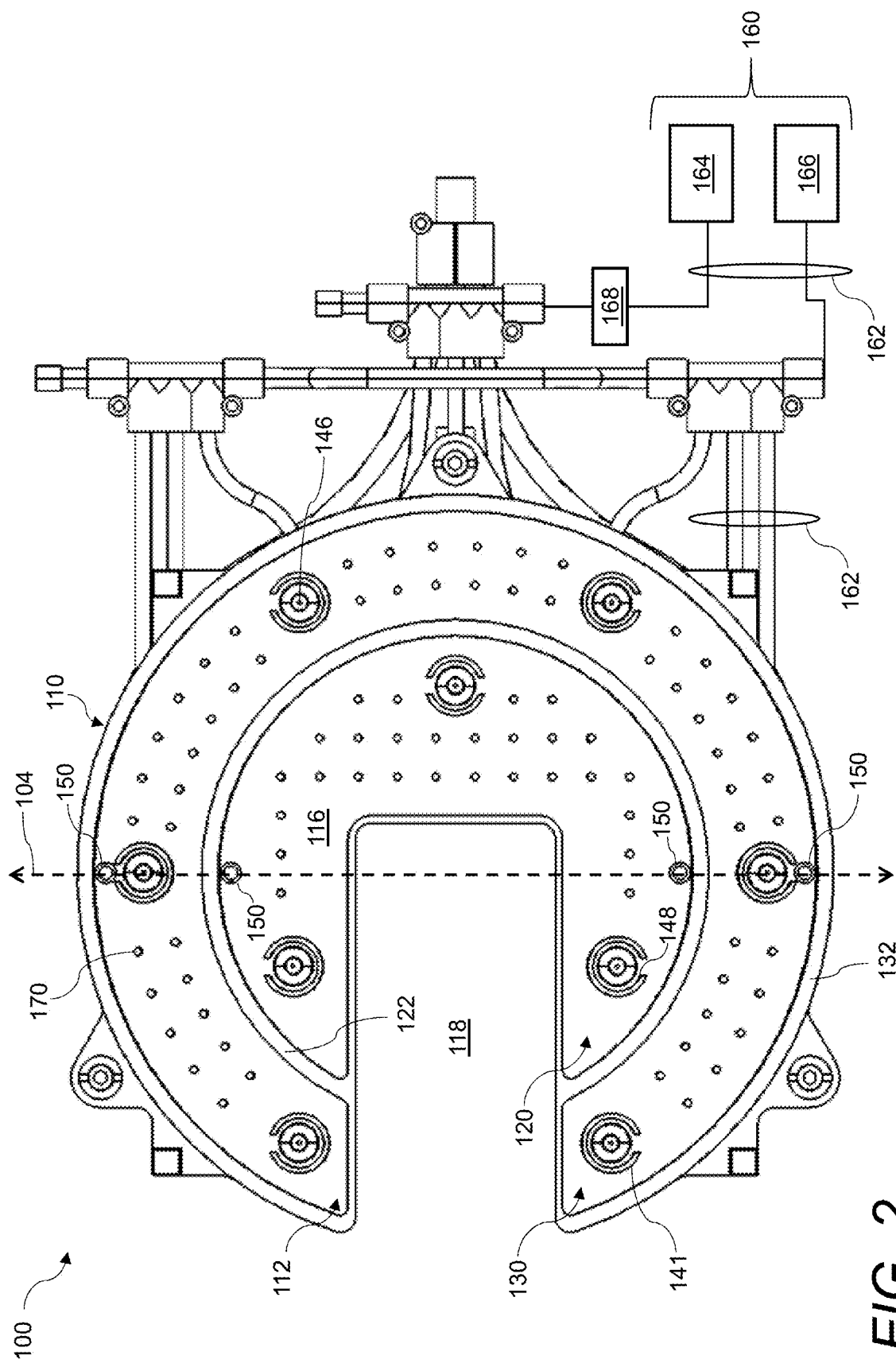
FIG. 2 is a top view of a wafer chuck, in accordance with a representative embodiment.

FIG. 1 is a top perspective view of a wafer chuck 100, in accordance with a representative embodiment, and FIG. 2 is a top view of the wafer chuck 100. In particular, FIG. 1 shows a wafer chuck 100 holding a wafer 101 (shown in representative form, where it is substantially transparent for ease of reference). In general, the wafer chuck 100 may include a support structure 110 having a first side 112 structurally configured to support a wafer 101, and a second side 114 that is disposed opposite the first side 116. In certain implementations, the first side 112 is a top of the wafer chuck 100 and the second side 114 is a bottom of the wafer chuck 100.

The support structure 110, and any other parts of the wafer chuck 100, may be formed out of the same or similar materials to wafer chucks of the prior art, including without limitation one or more of a ceramic or a metal. For example, the support structure 110 of the wafer chuck 100 may be formed of stainless steel or anodized aluminum.

As discussed herein, the wafer chuck 100 may be sized and shaped to hold a wafer 101, and may incorporate a form of vacuum or other suction to hold the wafer 101 in place, and to further unwarp a wafer 101 that includes a warped shape or surface. To this end, the wafer chuck 100 may include one or more vacuum zones formed on the first side 112 of the support structure 110—e.g., a first vacuum zone 120 and a second vacuum zone 130.

As shown in the figure, the first vacuum zone 120 may be at least partially bounded by a ring (e.g., a first ring 122 as shown in the figure) extending from a recessed surface 116 of the first side 112 of the support structure 110. The second vacuum zone 130 may at least partially surround the first vacuum zone 120, where the second vacuum zone 130 is bounded at least partially by the first ring 122 and bounded at least partially by a second ring 132 extending from the recessed surface 116 of the first side 112 of the support structure 110. As such, the second ring 132 may have a larger diameter than the first ring 122. As shown in the figure, the second ring 132 may define a perimeter of the support structure 110.

The vacuum zones may be sized and shaped to correspond to different sized wafers. For example, one or more of the first ring 122 and the second ring 132 may be sized and shaped to conform with predetermined wafer sizes, e.g., for placement of a wafer 101 having a first size in the first vacuum zone 120 and for placement of a wafer having a second size in the second vacuum zone 130. In this manner, the wafer chuck 100 can support a variety of sizes of wafers 101. By way of example, the wafer chuck 100 may support one or more of a 2-inch, 4-inch, 5-inch, 6-inch, 8-inch, and 12-inch diameter wafer 101.

The rings included on the support structure 110 of the wafer chuck 100 may each include contact surfaces for engagement with wafers 101, e.g., a particularly-sized and shaped wafer 101. In this manner, the first ring 122 may include a first contact surface 124 and the second ring 132 may include a second contact surface 134, where the first contact surface 124 and the second contact surface 134 are substantially coplanar. It will be understood that "substantially coplanar" shall mean within a tolerance acceptable in the art of inspecting wafers 101, e.g., within about 300 µm. In alternate embodiments, the first contact surface 124 and the second contact surface 134 are disposed at different z-axis heights, i.e., such that they are not substantially coplanar. As shown in FIG. 1, because of a sloped, non-planar face of the recessed surface 116 of the support structure 110 (e.g., for draining purposes as described below), a height of one or more of the first contact surface 124 and the second contact surface 134 above the recessed surface 116 may vary along a length of one or more of the first ring 122 and the second ring 132. That is, in certain implementations, the height of the first contact surface 124 and the second contact surface 134 may vary relative to the recessed surface 116, but may be the same relative to a z-axis or other reference point that is separate from the sloped, non-planar recessed surface 116.

The wafer chuck 100 may include a plurality of suction cups 140 disposed in one or more of the vacuum zones. For example, the first vacuum zone 120 may include one or more suction cups 140, and the second vacuum zone 130 may include one or more suction cups 140. Thus, each of the vacuum zones may include suction cups 140. Each of the plurality of suction cups 140 may include a stem 142 connected to a contact surface 144, where the contact surface 144 is structurally configured to support the wafer 101 and the stem 142 is structurally configured to support the contact surface 144. The suction cups 140, and more specifically the contact surface 144 thereof, may be made of one or more materials that are compressible. Specifically, the suction cups 140, and more specifically the contact surface 144 thereof, may be compressible enough to change a z-axis height of the suction cups 140 (e.g., to allow for the wafer 101 to contact one or more of the ring and the posts 170 when suction is applied by the one or more vacuums 160 as described herein), but also rigid enough to support the wafer 101.

One or more of the plurality of suction cups 140 may be coupled with a channel 146 extending through the support structure 110. The channel 146 may thus extend from the first side 112 of the support structure 110 to the second side 114 of the support structure 110. One or more vacuums 160 may be in fluid communication with the channel 146, as shown in FIG. 2, where at least one of the vacuums 160 is structurally configured to provide suction through the channel 146. In certain implementations, each of the plurality of suction cups 140 in the wafer chuck 100 is coupled with the channel 146—e.g., each of the plurality of suction cups 140 in the wafer chuck 100 may include its own channel 146 to which it is coupled. In other implementations, only some of the plurality of suction cups 140 in the wafer chuck 100 are coupled with a channel 146.

A suction cup 140 being coupled with a channel 146 will be understood to include implementations where the channel 146 is disposed within the suction cup 140, where the channel 146 is contained within a cavity 148 (see, e.g., FIG. 4, described below) or other structure in which the suction cup 140 is disposed (e.g., a standoff 141 as shown in the figure), or other implementations where the suction cup 140 is disposed within a path of suction applied through the channel 146 (e.g., a flow path caused by the suction). In this manner, when a wafer 101 is placed on the contact surface 144 of one or more of the suction cups 140, suction applied through the channel 146 may cause the wafer 101 (which may be warped) to contact each of the plurality of suction cups 140 and one of the rings, thereby pulling the wafer 101 and mitigating warping thereof.

As discussed above, the channel 146 may be disposed within the suction cup 140. In such implementations, the channel 146 may be disposed through the stem 142 and the contact surface 144 of one or more of the plurality of suction cups 140.

As discussed above, one or more of the plurality of suction cups 140 may be disposed within a standoff 141. The standoff 141 may include one or more walls 143 or other structures that surround a cavity 148 (through the support structure 110) in which a suction cup 140 is contained. A z-axis height of the standoff 141 (e.g., of a top surface 145 of the walls 143 of the standoff 141) may correspond to a z-axis height of a contact surface of one or more of the rings (e.g., the first contact surface 124 of the first ring 122 and the second contact surface 134 of the second ring 132). Further, a z-axis height of the contact surface 144 of a suction cup 140 may be disposed above one or more of the z-axis height of the contact surface of the rings and the z-axis height of the top surface 145 of the walls 143 of the standoff 141. In this manner, the contact surface 144 of each of the plurality of suction cups 140 may be compressible to the height of the standoff 141 in certain implementations. Further, a height of one or more of the plurality of suction cups 140 may be adjustable via movement of the stem 142 along a z-axis 102. In this manner, the z-axis height of the contact surface 144 of a suction cup 140 may be adjusted, e.g., depending upon warpage of a wafer 101.

As discussed above, the channel 146 may be disposed within a standoff 141 that contains a suction cup 140. In this manner, the channel 146 may be separate from the stem 142 and the contact surface 144 of a suction cup 140.

The wafer chuck 100 may further include a plurality of vacuum holes 150 disposed in one or more of the vacuum zones and extending through the support structure 110. One or more of vacuums 160 may be in fluid communication with the plurality of vacuum holes 150, where at least one of the vacuums 160 is structurally configured to provide suction through the plurality of vacuum holes 150. Thus, certain implementations include both one or more suction cups 140 coupled with channels 146 with suction provided therethrough by one or more vacuums 160, and one or more vacuum holes 150 (separate and distinct from the channels 146) with suction provided therethrough by one or more vacuums 160.

One or more of the plurality of vacuum holes 150 may be disposed through the recessed surface 116. For example, in an implementation, each one of the vacuum holes 150 is disposed through the recessed surface 116. Other configurations are also or instead possible, such as where one or more of the plurality of vacuum holes 150 is disposed through one or more of the rings (e.g., the second ring 132, which forms a perimeter of the support structure 110 of the wafer chuck 100), or another portion of the support structure 110. An implementation may also lack the inclusion of vacuum holes 150 altogether, and instead may only include the channels 146 as described herein.

The vacuum holes 150 and channels 140 may work in conjunction with one another to mitigate warping in a wafer 101 and to hold and secure the wafer 101 on a wafer chuck 100, e.g., for inspection with a scanning acoustic microscope. For example, as discussed above, a contact surface 144 of one or more of the plurality of suction cups 140 may protrude at least a first height H1 above a z-axis height of one or more of the rings, the standoffs 141, or another portion of the support structure 110 (see, e.g., FIG. 5, described below). The first height H1 may be about 1-2 mm, which may be used for warpage of up to about 2 mm included on a wafer 101. Other dimensions are also or instead possible. In this manner, a wafer 101 placed onto the support structure 110 may initially rest on a plurality of suction cups 140 (in a specific vacuum zone or across multiple vacuum zones) before suction is provided by a vacuum 160. When suction is applied to the wafer 101 by a vacuum 160, the wafer 101 may contact each of the plurality of suction cups 140 (in a specific vacuum zone or across multiple vacuum zones) and a ring thereby pulling the wafer 101 and mitigating warping thereof. The wafer 101 contacting each of the plurality of suction cups 140 and the ring may also or instead form a seal in a specific vacuum zone or across multiple vacuum zones. For example, as shown in the figure, the wafer 101 may form a seal with the first ring 122, e.g., by being pulled down by the suction of a vacuum (through one or more of a channel 146 or a vacuum hole 150) thereby causing the wafer 101 to engage the first contact surface 124 of the first ring 122. Further, a plurality of vacuum holes 150 may be disposed in a vacuum zone and extend through the support structure 110, where one or more vacuums 160 are in fluid communication with the plurality of vacuum holes 150 and are structurally configured to provide suction through the plurality of vacuum holes 150 to secure the wafer 101 and maintain the seal with a ring. One or more vacuums 160 may also or instead be structurally configured to apply suction through the plurality of vacuum holes 150 to further pull the wafer 101, which may in turn further mitigate warping of the wafer 101.

The vacuum holes 150 may be aligned with one another, e.g., for draining as described below, or for another purpose. For example, and as best shown in FIG. 2, two or more of the plurality of vacuum holes 150 may be aligned with one another along an axis, e.g., a centerline axis 104 representing a centerline of the support structure 110. In certain implementations, each of the vacuum zones in a wafer chuck 100 includes at least two vacuum holes 150, e.g., one on each side of the vacuum zone.

One or more of the vacuum holes 150 may also or instead be used to drain fluid from the wafer chuck 100, e.g., during inspection of the wafer 101, and more particularly, if water or other liquid makes its way into one or more of the vacuum zones of the wafer chuck 100. In this manner, the recessed surface 116 may be sloped toward one or more of the plurality of vacuum holes 150. To this end, the wafer chuck 100, or a system 1000 including the wafer chuck 100 (see FIG. 8), may include a water separator 168 in a vacuum line 162 between a vacuum 160 and one or more of the plurality of vacuum holes 150. In this manner, the suction from one or more of the vacuum holes 150 may be able to rid the wafer chuck 100 of any water (or other liquid) that becomes present in the wafer chuck 100.

There may be one or more vacuum lines 162 connecting one or more vacuums 160 to the plurality of vacuum holes 150 (and the channels 146), as further described below. In general, the vacuum lines 162 may be connected to, and disposed on, the second side 114 of the support structure 110.

As discussed herein, the wafer chuck 100, or a system 1000 including the wafer chuck 100 (see FIG. 8), may include one or more vacuums 160, where one or more of the vacuums 160 is in fluid communication with the vacuum holes 150 and the channels 146 coupled with one or more of the suction cups 140. The vacuums 160 may be configured such that channels 146 are all on a single vacuum line 162 (e.g., or multiple vacuum lines 162 that are connected to the same vacuum 160), or the vacuums 160 may be configured such that channels 146 are on different vacuum lines 162. Similarly, the vacuums 160 may be configured such that vacuum holes 150 are all on a single vacuum line 162 (e.g., or multiple vacuum lines 162 that are connected to the same vacuum 160), or the vacuums 160 may be configured such that the vacuum holes 150 are on different vacuum lines 162. Additionally, or alternatively, the vacuums 160 may be configured such that different vacuum zones are on different vacuum lines 162. The vacuums 160 may instead be configured such that multiple vacuum zones are on the same vacuum line 162 (e.g., or multiple vacuum lines 162 that are connected to the same vacuum 160). For example, one or more of vacuum zones could be on the same line as the suction cups 140 or certain suction cups 140, or the vacuum holes 150 or certain vacuum holes 150.

Although certain configurations are described for the vacuums 160 and vacuum lines 162 with respect to one or more of the channels 146, the vacuum holes, and the vacuum zones (e.g., the first vacuum zone 120 and the second vacuum zone 130), it will be understood that nearly an infinite number of configurations are possible, each of which is intended to be included in the scope of this disclosure.

For example, in certain implementations, the vacuums 160 include a first vacuum 164 in fluid communication with each of the plurality of vacuum holes 150 (or certain vacuum holes 150), and a second vacuum 166 in fluid communication with the channels 146 (or certain channels 146). Alternatively, a single vacuum 160 may be in fluid communication with each of the plurality of vacuum holes 150 and the channels 146. In other implementations, the vacuums 160 include a first vacuum 164 in fluid communication with the plurality of vacuum holes 150 disposed in the first vacuum zone 120 and the plurality of suction cups 140 (i.e., the channels 146 coupled with the suction cups 140) disposed in the first vacuum zone 120, and a second vacuum 166 in fluid communication with the plurality of vacuum holes 150 disposed in the second vacuum zone 130 and the plurality of suction cups 140 (i.e., the channels 146 coupled with the suction cups 140) disposed in the second vacuum zone 130. The first vacuum 164 may instead be in fluid communication with the plurality of vacuum holes 150 disposed in both the first vacuum zone 120 and the second vacuum zone 130, and the second vacuum 166 may be in fluid communication with the plurality of suction cups 140 (i.e., the channels 146 coupled with the suction cups 140) disposed in both the first vacuum zone 120 and the second vacuum zone 130. Alternatively, a single vacuum 160 may be in fluid communication with each of the plurality of vacuum holes 150 and the plurality of suction cups 140 (i.e., the channels 146 coupled with the suction cups 140) in both the first vacuum zone 120 and the second vacuum zone 130.

As discussed above, it will be understood that nearly an infinite number of configurations are possible for connecting one or more vacuums 160 to the plurality of vacuum holes 150 and the plurality of suction cups 140 (i.e., the channels 146 coupled with the suction cups 140) disposed in one or more vacuum zones. Further, it will be understood that the one or more vacuums 160 may include any number of vacuums 160, i.e., not just two vacuums 160 as shown in FIG. 2. The number of vacuums 160, or the size or power of the vacuums 160, may be selected to ensure that the vacuums 160 provide enough capacity to pull the wafer 101 substantially flat.

As described herein and shown in the figures, the second vacuum zone 130 may include one or more of the plurality of suction cups 140, where at least one of the plurality of suction cups 140 in the second vacuum zone is coupled with a channel 146 for providing suction therethrough via a vacuum 160. Thus, each of the vacuum zones may include suction cups 140 coupled with channels 146 for providing suction in or around the suction cups 140. Further, a plurality of vacuum holes 150 as described herein may be disposed in each of the first vacuum zone 120 and the second vacuum zone 130, where the plurality of vacuum holes 150 extend through the support structure 110. One or more vacuums 160 may be in fluid communication with the plurality of vacuum holes 150 in each of the first vacuum zone 120 and the second vacuum zone 130.

The wafer chuck 100 may further include a cutout 118 in its shape, e.g., a cutout 118 in the support structure 110 itself. In this manner, one or more of the first vacuum zone 120 and the second vacuum zone 130 may be further bounded by the cutout 118 of the support structure 110. The cutout 118 may be sized and shaped to accommodate the arm of a positioning robot, e.g., for quickly moving wafers 101 onto and off of the wafer chuck 100, or for other purposes such as for moving the wafer chuck 100 itself. Thus, the wafers 101 may be quickly and easily movable into and out of the wafer chucks 100, and the wafer chucks 100 themselves may be quickly and easily movable into and out of a scanning acoustic microscope.

The wafer chuck 100 may further include a plurality of posts 170 disposed in one or more of the vacuum zones. As shown in the figures, the posts 170 may extend from the recessed surface 116 of the support structure 110. Each of the plurality of posts 170 may be shaped as a column, e.g., having a substantially cylindrical shape. One or more of the plurality of posts 170 may have a height corresponding to a height of a contact surface of one or more of the rings—e.g., the posts 170 may generally have a height that is coplanar with one or more of the first contact surface 124 of the first ring 122 and the second contact surface 134 of the second ring 132. In other implementations, one or more of the plurality of posts 170 has a height disposed below a height of a contact surface of one or more of the rings. The plurality of posts 170 may be structurally configured to maintain a predetermined flatness of the wafer 101 when suction is applied to a wafer 101 that is disposed on the wafer chuck 100. Further, a number and a size of the plurality of posts 170 may be selected to minimize a surface area contacting the wafer 101 while providing a predetermined support to the wafer 101.

The posts 170 may represent an improvement over other wafer chucks in the prior art. Specifically, other wafer chucks in the prior art may include a greater number of flat surfaces with relatively large surface areas that contact a wafer 101 when holding the wafer 101 for inspection. However, in the present teachings, a wafer chuck 100 may include the posts 170, which may provide support to aid in holding a wafer 101 and may also or instead aid in maintaining a predetermined flatness of the wafer 101, e.g., in addition to a ring disposed around a vacuum zone. Without the posts 170, it is possible that the wafer 101 could bow down in-between the ring due to the suction in the vacuum zone, thus not achieving a desired flatness for the wafer 101. However, if the posts 170 were replaced with another component having a relatively large surface area, the wafer 101 could stick to the wafer chuck 101 during removal. Thus, the size, shape, and number of the posts 170 may be selected and designed to achieve a predetermined support and a predetermined flatness, while mitigating sticking to the wafer 101 during removal of the wafer 101 from the wafer chuck 100.

Figure 3:
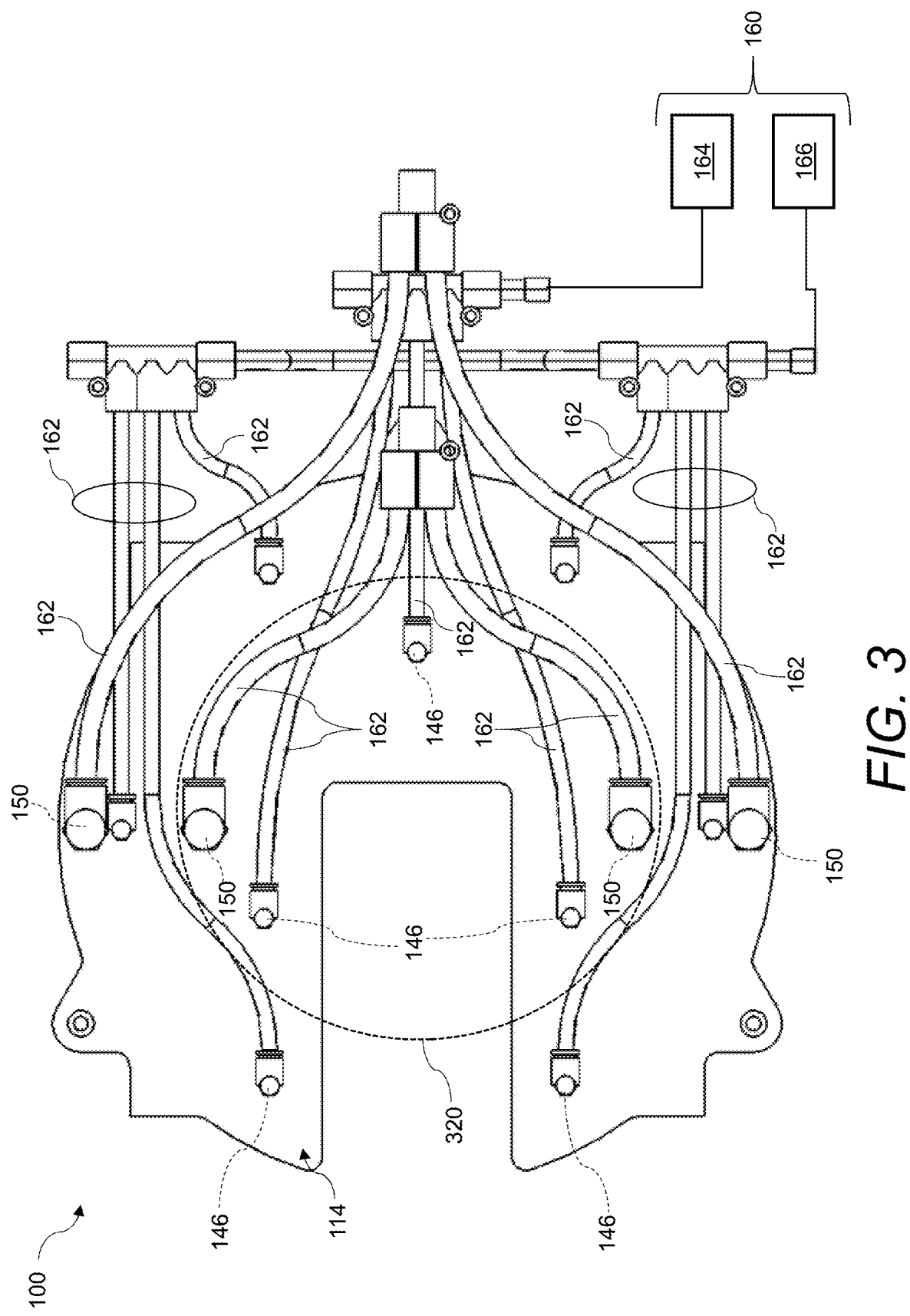
FIG. 3 is a bottom view of a wafer chuck, in accordance with a representative embodiment.

FIG. 3 is a bottom view of a wafer chuck 100, in accordance with a representative embodiment. Specifically, FIG. 3 is a bottom view of the wafer chuck 100 that is shown in FIGS. 1 and 2. In the implementation shown in FIG. 3, each of the suction cups (i.e., the channels 146 coupled with the suction cups) and the vacuum holes 150 in a first vacuum zone for smaller wafers (represented by the dotted line 320) are connected to vacuum lines 162 in fluid communication with a first vacuum 164 such that suction is applied to these elements at substantially the same time. Similarly, channels 146 and vacuum holes 150 in a second vacuum zone 130 for larger wafers (those disposed outside of the dotted line 320) are connected to vacuum lines 162 in fluid communication with a second vacuum 166.

As shown in FIG. 3, one or more of the vacuum lines 162 may converge into a single vacuum line 162 such that one or more of the channels 146 and the vacuum holes 150 may be controlled by a single vacuum 160. Alternatively, the vacuum lines 162 may separately connect to each of the channels 146 and the vacuum holes 150 and run independently to one or more vacuums 160, e.g., for separate and independent control of each of the channels 146 and the vacuum holes 150.

Figure 4:
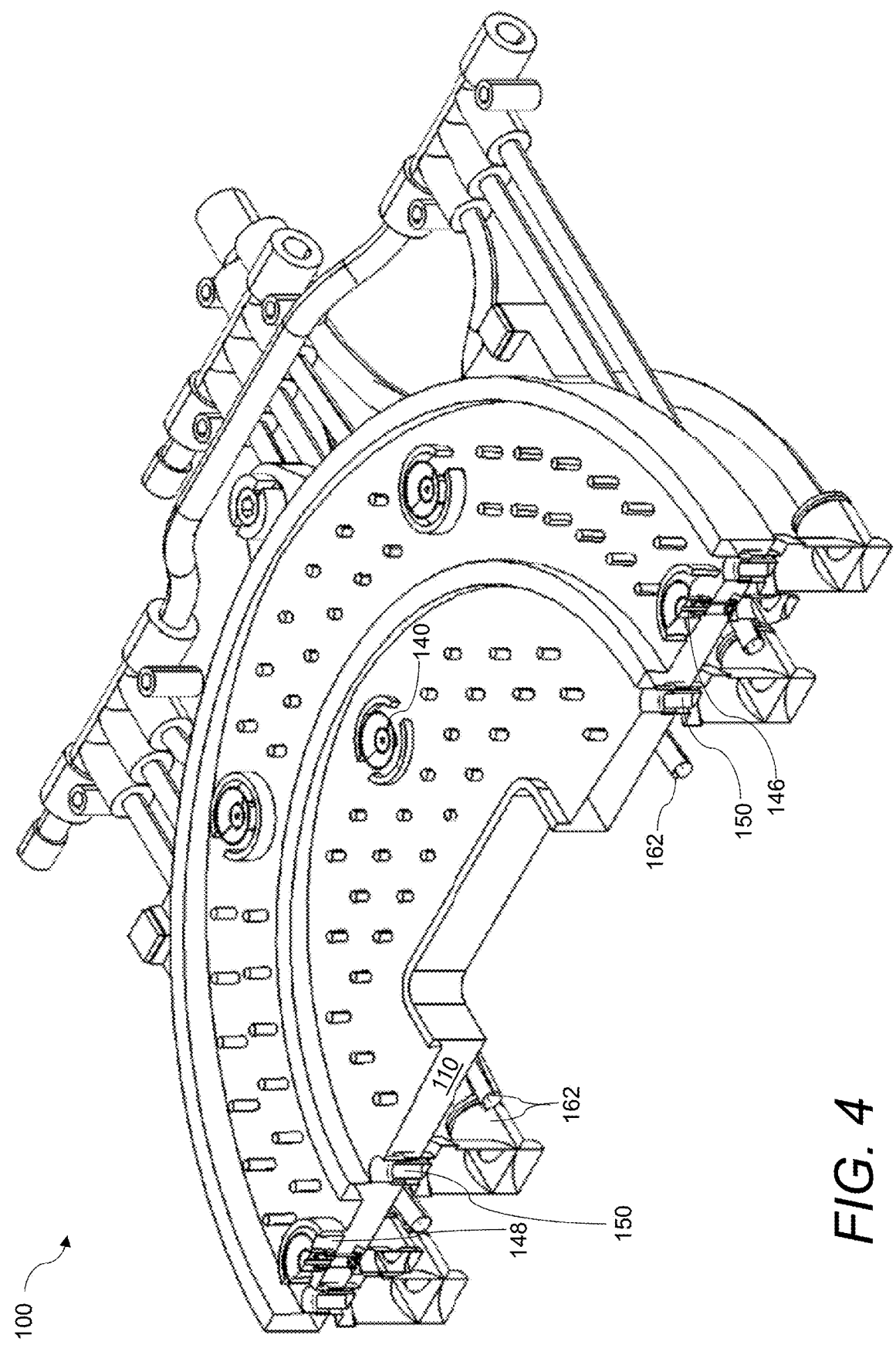
FIG. 4 is a cutaway view of a wafer chuck, in accordance with a representative embodiment.
Figure 5:
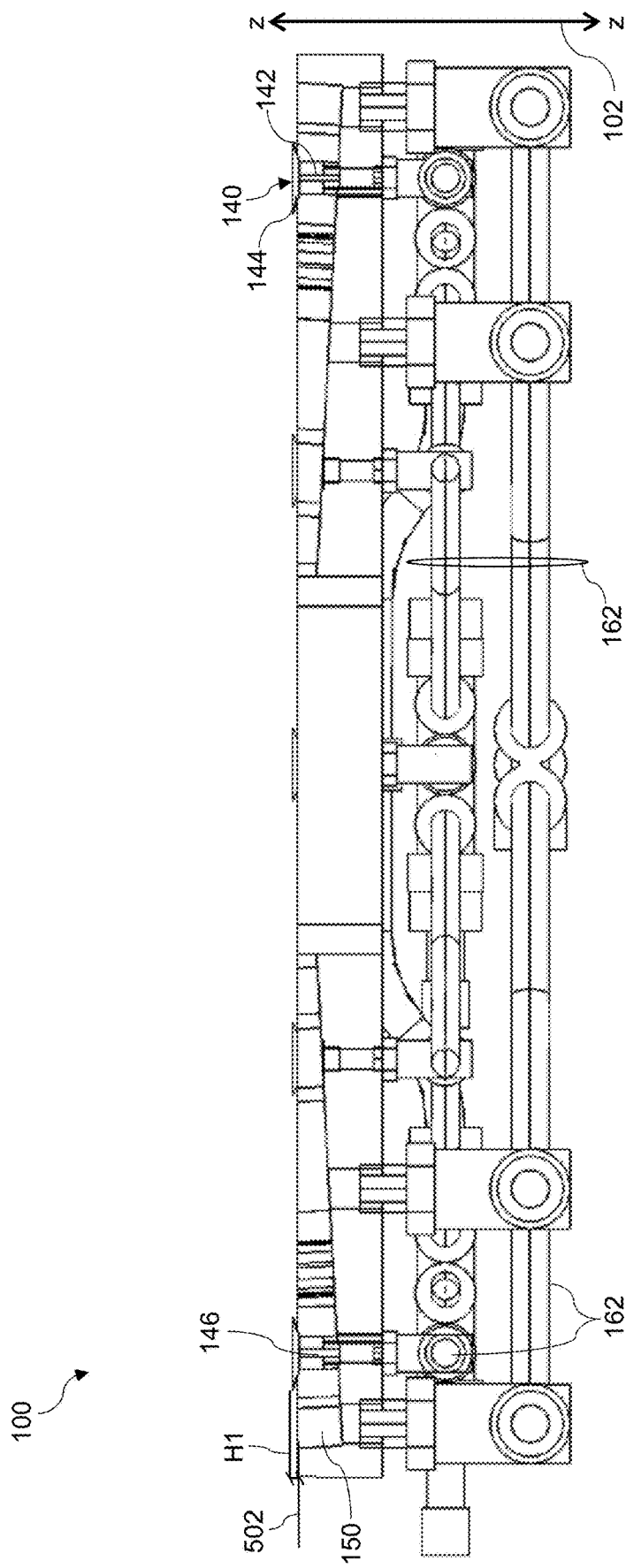
FIG. 5 is a cross-sectional view of a wafer chuck, in accordance with a representative embodiment.

FIG. 4 is a cutaway view of a wafer chuck 100, in accordance with a representative embodiment, and FIG. 5 is a cross-sectional view of the cutaway wafer chuck 100 in FIG. 4. These figures clearly show the channels 146 and the vacuum holes 150 extending through the support structure 110, and their connection to vacuum lines 162, where the embodiment of FIGS. 4 and 5 includes a channel 146 formed within the suction cups 140 themselves. Specifically, in this embodiment, the channel 146 extends through the stem 142 of the suction cups 140, from the vacuum line 162 to the contact surface 144 of the suction cup 140. Thus, in this embodiment, the channel 146 is integrated into the suction cup 140.

As also shown in FIG. 5, the contact surface 144 of one or more of the plurality of suction cups 140 may protrude at least a first height H1 above a z-axis height 502 of both the first ring 122 and the second ring 132. The first height H1 of the contact surface 144 of one or more of the plurality of suction cups 140 may also or instead be adjustable along the z-axis 102. To this end, the wafer chuck 100 may include one or more actuators (e.g., a hydraulic actuator such as a hydraulic piston/cylinder), motors, gears, belts, or the like, e.g., connected to the stem 142 of a suction cup 140 for providing movement thereof. Other configurations for movement of the suction cups 140 are also or instead possible. Also, or instead, different suction cups 140 each having different lengths of stems 142 may be provided, e.g., for different types or sizes of wafers 101. In this manner, the suction cups 140 may be removable and replaceable on the wafer chuck 100. Similarly, the contact surfaces 144 may also or instead vary between different suction cups 140.

FIG. 6 illustrates a representation of a side view of a wafer chuck 100 holding a wafer 101 before suction is applied, in accordance with a representative embodiment, and FIG. 7 illustrates a side view of the wafer chuck 100 holding the wafer 101 when suction is being applied. As shown in FIG. 6, one or more of the plurality of suction cups 140 may protrude at least a first height H1 above the rest of the wafer chuck 100. In this manner, when the wafer 101 is initially placed onto the wafer chuck 100, the wafer 101 may be supported by one or more of the plurality of suction cups 140, e.g., depending on a warping of the wafer 101. Suction may then be applied to the wafer 101, e.g., through a channel contained in, or otherwise coupled with, one or more of the plurality of suction cups 140. This suction may pull the wafer 101 down onto each of the suction cups 140, even if the wafer 101 is warped. Because the suction cups 140 may be compressible (e.g., the contact surface of the suction cups 140 may be compressible by an amount equal to the height H1 above the rings of the wafer chuck 100), suction applied through the channels may not only pull the wafer 101 down to contact each of the plurality of suction cups 140, but the suction may also pull the wafer 101 down to contact the support structure of the wafer chuck 100 (e.g., the ring disposed around a vacuum zone). This may substantially flatten the wafer 101 as shown in FIG. 7. Thus, as shown in FIG. 6, the wafer 101 may initially be warped, but when the wafer 101 is secured onto the wafer chuck 100 as shown in FIG. 7, the wafer 101 may be substantially flattened or unwarped, or warping may otherwise be mitigated or lessened. After the wafer 101 is pulled down via suction from the channels to contact the support structure of the wafer chuck 100 (e.g., a ring of a vacuum zone), a seal may be formed, and vacuum holes included on the support structure of the wafer chuck 100 may hold the wafer 101 securely on the support structure of the wafer chuck 100, e.g., for inspection with a scanning acoustic microscope. Also, or instead, the vacuum holes may mitigate warping of the wafer 101. For example, the channels may apply suction to create a seal with the wafer chuck 101 and the vacuum holes may perform the function of substantially flattening the wafer 101. Thus, in an implementation, only the vacuum holes mitigate warping of the wafer 101; in another implementation, only the channels mitigate warping of the wafer 101; and in yet another implementation, a combination of both the vacuum holes and the channels mitigate warping of the wafer 101.

Turning back to FIG. 6, it will be appreciated that the wafer 101 may be initially warped as shown by way of representation in the figure. The warping may be minimal, e.g., where the wafer 101 still contacts, and is able to form a seal with, the contact surface of each of the plurality of suction cups 140 upon an initial placement onto the wafer chuck 100. The warping may instead be more significant, where the wafer 101 contacts only some of the plurality of suction cups 140 for forming a seal therewith upon an initial placement onto the wafer chuck 100. In this manner, when suction is applied through the channel (e.g., through the suction cups), the suction may act to pull the wafer 101 down onto other suction cups 140, which may then also apply suction to the wafer 101 through channels thereof. In this manner, each of the suction cups 140 may eventually contact and form a seal with the wafer 101. In yet some other embodiments, the warping may be so significant that the wafer 101 contacts some of the plurality of suction cups 140, but does not form a seal therewith upon an initial placement onto the wafer chuck 100. In such cases, the seal may be created when suction is applied through the channel (e.g., through the suction cups), i.e., with enough force to draw the wafer 101 toward the suction cups 140 to form a seal.

Figure 8:
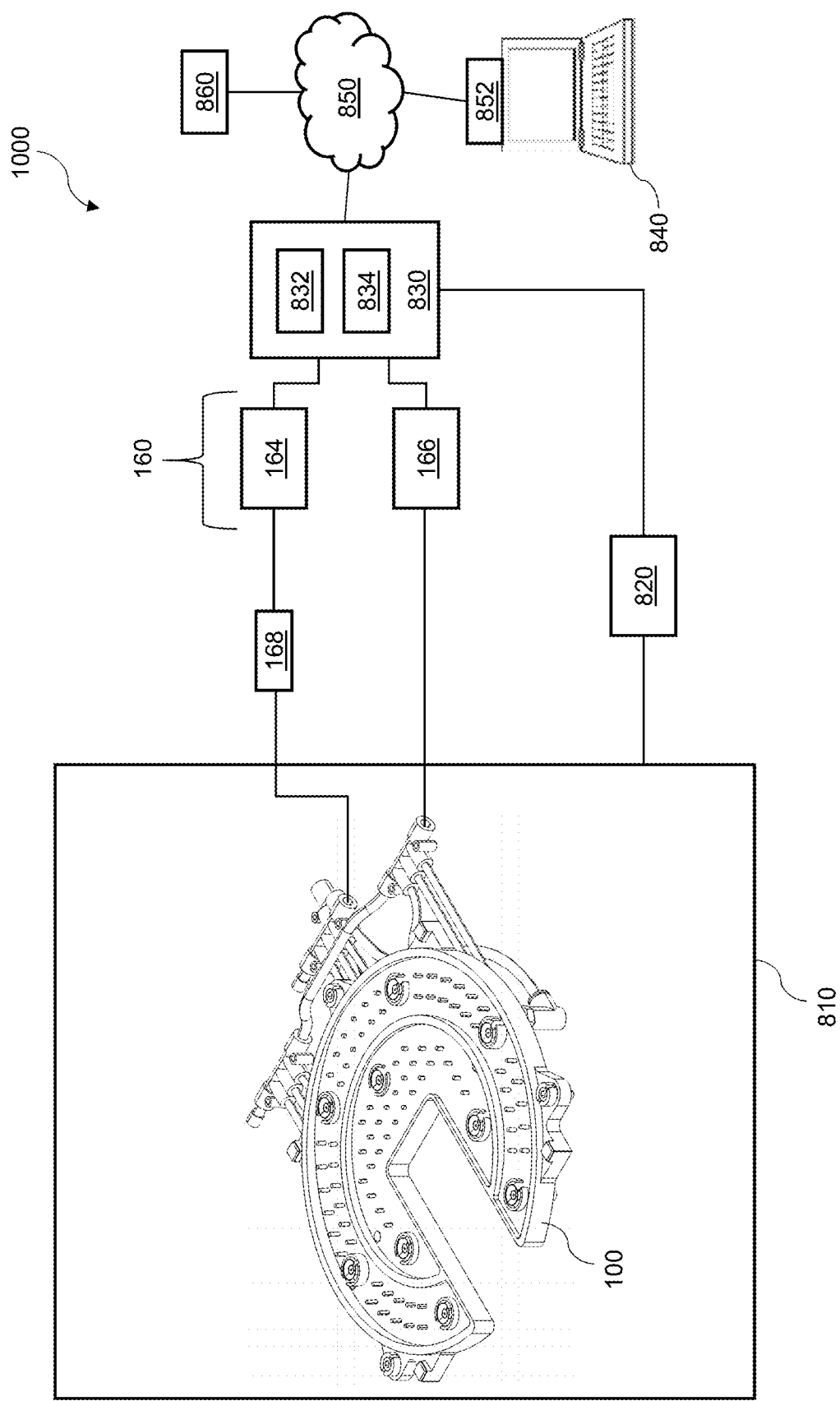
FIG. 8 illustrates a system for inspecting wafers, in accordance with a representative embodiment.

FIG. 8 illustrates a system 1000 for inspecting wafers, in accordance with a representative embodiment. The system 1000 may include a wafer chuck 100, a scanning acoustic microscope 810, one or more vacuums 160 (e.g., a first vacuum 164 and a second vacuum 166), a water separator 168, a positioning robot 820, a controller 830, a computing device 840, a data network 850, and other resources 860.

The wafer chuck 100 in the system 1000 may be the same or similar to any of the wafer chucks 100 described herein, e.g., with reference to FIGS. 1-7. For example, the wafer chuck 100 may include one or more vacuum zones each having a plurality of vacuum holes and a plurality of suction cups, where one or more of the suction cups is coupled with a channel for providing suction therethrough. The design of the wafer chuck 100 may mitigate warping of a wafer when placed thereon and when suction is applied through one or both of the channels and the vacuum holes. The suction may be provided by the vacuums 160 (e.g., a first vacuum 164 and a second vacuum 166), where a water separator 168 may be disposed in a vacuum line connecting a vacuum 160 to the vacuum holes and channels of the wafer chuck 100.

The wafer chuck 100 may be configured for use with the scanning acoustic microscope 810, where the wafer chuck 100 holds or secures a wafer for inspection by the scanning acoustic microscope 810. The wafer chuck 100 may also or instead mitigate warping in a wafer thereby facilitating improved inspection by the scanning acoustic microscope 810. The scanning acoustic microscope 810 may be any as described herein or otherwise known in the art. In other implementations, the scanning acoustic microscope 810 may be supplemented or replaced by another piece of equipment for inspection, measuring, or analysis of the wafer being secured by the wafer chuck 100.

The positioning robot 820 may be used to position one or more of the wafer chuck 100, the wafers, or the scanning acoustic microscope 810 relative to one another. A variety of arrangements and techniques are known in the art to achieve controlled movement and the positioning robot 820 may include any of these arrangements and techniques. The positioning robot 820 may, for example, and without limitation, include various combinations of stepper motors, encoded DC motors, gears, belts, pulleys, worm gears, threads, robotic arms, and so forth.

The controller 830 may be in communication with one or more of the components of the system 100 for control thereof. For example, the controller 830 may be in communication with one or more vacuums 160, where the controller 830 is structurally configured to control suction in one or more of the vacuum zones on the wafer chuck 100 through control of the vacuums 160 or a component thereof (e.g., a valve or the like included in the vacuum 160 or disposed on a vacuum line). The controller 830 may also or instead be used to control the wafer chuck 100 and its components, the scanning acoustic microscope 810, the water separator 168, the positioning robot 820, the other resources 860, and combinations thereof.

The controller 830 may include, or may otherwise be in communication with, a processor 832 and a memory 834. The controller 830 may be electronically coupled (e.g., wired or wirelessly) in a communicating relationship with one or more of the components of the system 1000. The controller 830 may include any combination of software and/or processing circuitry suitable for controlling the various components of the system 1000 described herein including without limitation processors 832, microprocessors, microcontrollers, application-specific integrated circuits, programmable gate arrays, and any other digital and/or analog components, as well as combinations of the foregoing, along with inputs and outputs for transceiving control signals, drive signals, power signals, sensor signals, and the like. In certain implementations, the controller 830 may include the processor 832 or other processing circuitry with sufficient computational power to provide related functions such as executing an operating system, providing a graphical user interface (e.g., to a display coupled to the controller 830 or another component of the system 1000), set and provide rules and instructions for operation of a component of the system 1000, convert sensed information into instructions, and operate a web server or otherwise host remote operators and/or activity through a communications interface 852 such as that described below.

The processor 832 may be any as described herein or otherwise known in the art. The processor 832 may be included on the controller 830, or it may be separate from the controller 830, e.g., it may be included on a computing device 840 in communication with the controller 830 or another component of the system 1000. In an implementation, the processor 832 is included on or in communication with a server that hosts an application for operating and controlling components of the system 1000.

The memory 834 may be any as described herein or otherwise known in the art. The memory 834 may contain computer code and may store data such as instructions for, e.g., controlling the vacuums 160 or a valve. The memory 834 may also or instead store data related to performance of the wafer chuck 100 or system 1000. The memory 834 may contain computer executable code stored thereon that provides instructions for the processor 832 for implementation. The memory 834 may include a non-transitory computer readable medium.

The system 1000 may include a computing device 840 in communication with one or more of the components of the system 1000 including without limitation the controller 830. The computing device 840 may include a user interface, e.g., a graphical user interface, a text or command line interface, a voice-controlled interface, and/or a gesture-based interface. In general, the user interface may create a suitable display on the computing device 840 for operator interaction. In implementations, the user interface may control operation of one or more of the components of the system 1000, as well as provide access to and communication with the controller 830, processor 832, and other resources 860. The computing device 840 may thus include any devices within the system 1000 operated by operators or otherwise to manage, monitor, communicate with, or otherwise interact with other participants in the system 1000. This may include desktop computers, laptop computers, network computers, tablets, smartphones, or any other device that can participate in the system 1000 as contemplated herein. In an implementation, the computing device 840 is integral with another participant in the system 1000.

The data network 850 may be any network(s) or inter-network(s) suitable for communicating data and control information among participants in the system 1000. This may include public networks such as the Internet, private networks, telecommunications networks such as the Public Switched Telephone Network or cellular networks using third generation (e.g., 3G or IMT-2000), fourth generation (e.g., LTE (E-UTRA) or WiMAX-Advanced (IEEE 802.16m) and/or other technologies, as well as any of a variety of corporate area or local area networks and other switches, routers, hubs, gateways, and the like that might be used to carry data among participants in the system 1000. The data network 850 may include wired or wireless networks, or any combination thereof. One skilled in the art will also recognize that the participants shown the system 1000 need not be connected by a data network 850, and thus can be configured to work in conjunction with other participants independent of the data network 850.

Communication over the data network 850, or other communication between components of the system 1000, may be provided via one or more communications interfaces 852. The communications interface 852 may include, e.g., a Wi-Fi receiver and transmitter to allow calculations and the like to be performed on a separate computing device 840. More generally, the communications interface 852 may be suited such that any of the components of the system 1000 can communicate with one another. Thus, the communications interface 852 may be present on one or more of the components of the system 1000. The communications interface 852 may include, or be connected in a communicating relationship with, a network interface or the like. The communications interface 852 may include any combination of hardware and software suitable for coupling the components of the system 1000 to a remote device (e.g., a computing device 840 such as a remote computer or the like) in a communicating relationship through a data network 850. By way of example and not limitation, this may include electronics for a wired or wireless Ethernet connection operating according to the IEEE 802.11 standard (or any variation thereof), or any other short or long-range wireless networking components or the like. This may include hardware for short range data communications such as Bluetooth or an infrared transceiver, which may be used to couple into a local area network or the like that is in turn coupled to a data network such as the internet. This may also or instead include hardware/software for a WiMAX connection or a cellular network connection (using, e.g., CDMA, GSM, LTE, or any other suitable protocol or combination of protocols). Additionally, the controller 830 may be configured to control participation by the components of the system 1000 in any network to which the communications interface 852 is connected, such as by autonomously connecting to the data network 852 to retrieve updates and the like.

The system 1000 may include other resources 860. In certain implementations, the other resources 860 may include a camera, a power source, a sensor, a database, a valve, and the like. The other resources 860 may also or instead include input devices such as a keyboard, a touchpad, a computer mouse, a switch, a dial, a button, and the like, as well as output devices such as a display, a speaker or other audio transducer, light emitting diodes or other lighting or display components, and the like. Other resources 860 of the system 1000 may also or instead include a variety of cable connections and/or hardware adapters for connecting to, e.g., external computers, external hardware, external instrumentation or data acquisition systems, and the like.

Figure 9:
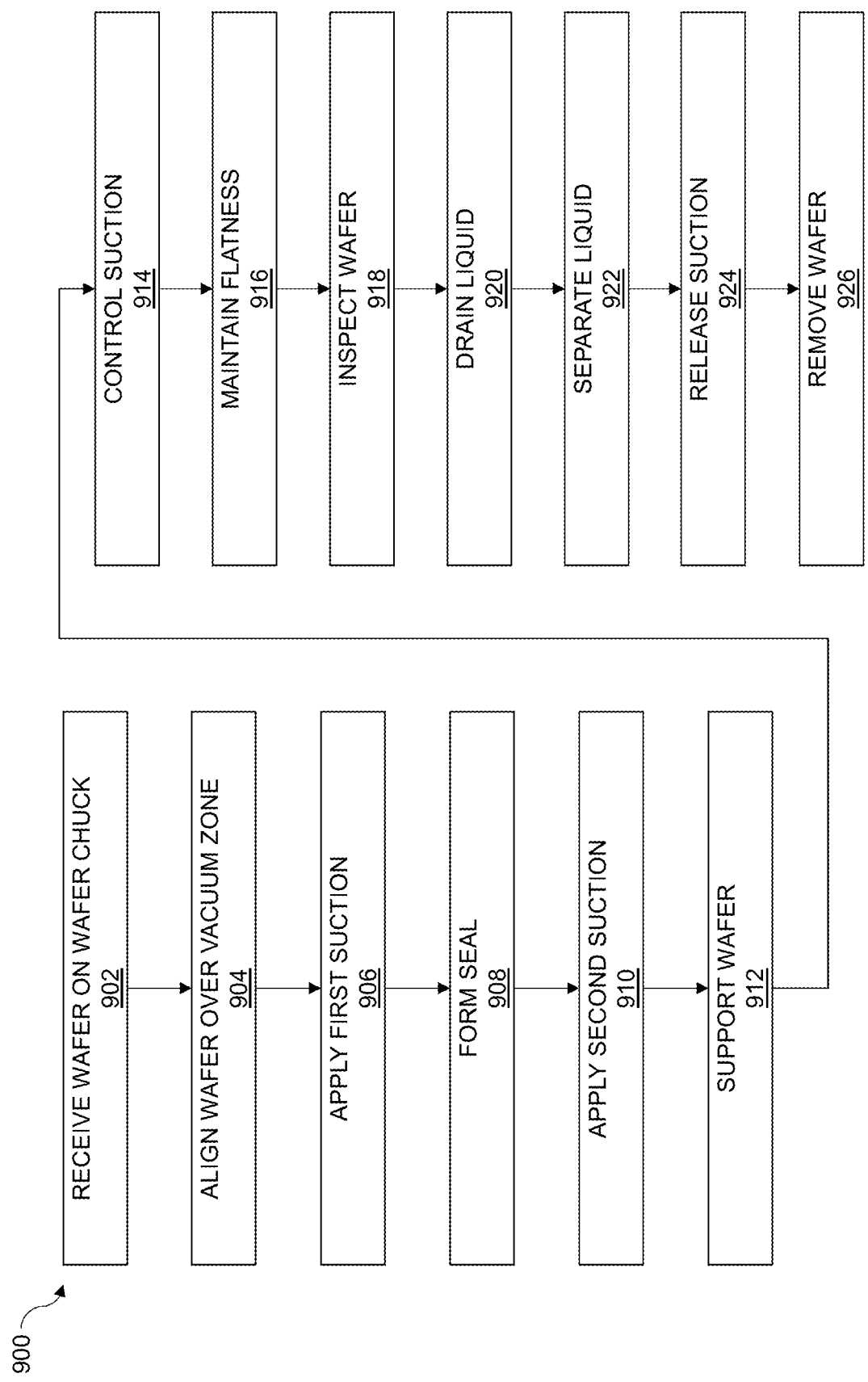
FIG. 9 is a flow chart of a method for inspecting a wafer, in accordance with a representative embodiment.

FIG. 9 is a flow chart of a method 900 for inspecting a wafer, in accordance with a representative embodiment. The method 900 may include the use of a wafer chuck as described herein.

As shown in block 902, the method 900 may include receiving a wafer on a first side of a wafer chuck. The wafer chuck may include one or more vacuum zones corresponding to a size and shape of the wafer, where each of the vacuum zones includes suction cups for receiving the wafer thereon. Receiving the wafer on the wafer chuck may thus include receiving the wafer on contact surfaces of one or more of the plurality of suction cups. The wafer may be received from a positioning robot or the like, e.g., where a positioning robot is programmed to place the wafer in a predetermined alignment on the wafer chuck.

As shown in block 904, the method 900 may include aligning the wafer over at least one of the vacuum zones. Alignment of the wafer may be performed by a positioning robot or the like, or manually by an operator. As discussed above, in certain implementations, a positioning robot may be programmed to place the wafer in a predetermined alignment on the wafer chuck, such that further alignment of the wafer is not necessary. Further, in this manner, alignment may be accomplished before placing the wafer onto the wafer chuck, i.e., through programming of the positioning robot.

As shown in block 906, the method 900 may include applying a first suction to the wafer. The first suction may be applied to the wafer through a channel coupled with one or more of a plurality of suction cups. The first suction may facilitate the wafer to be pulled toward the wafer chuck such that the wafer contacts each of the plurality of suction cups and a ring at least partially bounding a vacuum zone formed on the first side of the wafer chuck. The first suction may thereby mitigate warping of the wafer, e.g., by pulling the wafer down to contact the suction cups and the ring bounding the vacuum zone.

As shown in block 908, the method 900 may include forming a seal in the vacuum zone on the wafer chuck. The seal may be formed by the first suction acting on the wafer, where the first suction pulls a body of the wafer toward the suction cups and a ring at least partially bounding a vacuum zone on the wafer chuck.

As shown in block 910, the method 900 may include applying a second suction to the wafer through a plurality of vacuum holes thereby pulling the wafer toward a recessed surface of the wafer chuck and further mitigating the warping thereof. The second suction may also or instead further hold and secure the wafer on the wafer chuck for inspection by a scanning acoustic microscope.

In certain implementations, the first suction and the second suction are applied using a single vacuum. In other implementations, the first suction and the second suction are applied using separate vacuums. It will be understood that, regardless of whether a system is using a single vacuum or a plurality of vacuums, the first suction and the second suction may be applied at the same time, e.g., continuously before and during inspection of a wafer. The first suction and the second suction may instead be applied at different times, e.g., using different vacuums, or using the same vacuum by controlling valves or the like.

As shown in block 912, the method 900 may include supporting the wafer, e.g., using one or more posts included on the wafer chuck. The posts may also or instead assist in maintaining a predetermined flatness of the wafer on the wafer chuck.

As shown in block 914, the method 900 may include controlling suction applied to the wafer, e.g., controlling one or more of the first suction and the second suction. This may include controlling one or more vacuums in fluid communication with at least one of the channels and vacuum holes included on the wafer chuck. This may also or instead include controlling one or more valves included on one or more vacuum lines. In certain implementations, controlling suction includes limiting the suction applied to a wafer to mitigate damaging the wafer. In other implementations, controlling suction merely includes turning one or more vacuums on and off, or selecting which vacuums in a plurality of vacuums will apply suction, e.g., as a form of binary control of applying suction or not applying suction in the system. Thus, controlling suction may be accomplished or programmed in advance of inspection of a wafer. In certain implementations, the control of suction is determined based on one or more of a type of wafer to be inspected, a size of wafer to be inspected, the degree of warpage of a wafer, the type or size of a wafer chuck, a type or a parameter of a scanning acoustic microscope, and so on.

As shown in block 916, the method 900 may include maintaining a predetermined flatness of the wafer. The predetermined flatness of the wafer may mitigate warping thereof for sufficient inspection by a scanning acoustic microscope. The predetermined flatness may be less than or equal to about 300 µm of warpage across a surface of the wafer. In other implementations, the predetermined flatness may be less than or equal to about 50 µm of warpage across a surface of the wafer, or less than or equal to about 25 µm of warpage across a surface of the wafer. The predetermined flatness may be maintained by controlling the suction applied to the wafer, controlling a position of a suction cup of the wafer chuck, controlling a position of the wafer chuck itself or the wafer relative to the wafer chuck, and combinations thereof. The predetermined flatness may also or instead be maintained by the shape of the wafer chuck.

As shown in block 918, the method 900 may include inspecting the wafer using a scanning acoustic microscope. Inspection may also or instead include the use of other tools or instruments. Inspection of the wafer may be facilitated or improved upon by maintaining a predetermined flatness of the wafer before or during the inspection.

As shown in block 920, the method 900 may include draining a liquid through one or more of the plurality of vacuum holes, e.g., during inspection of the wafer, and more particularly, if water or other liquid makes its way into one or more of the vacuum zones of the wafer chuck. In certain implementations, for draining purposes, even if only one vacuum zone is being used for an inspection of a wafer, suction in each vacuum zone is applied, e.g., to remove any water that accumulates in each vacuum zone.

As shown in block 922, the method 900 may include separating the liquid (e.g., water) from another fluid (e.g., air) in a vacuum line between one or more vacuums and one or more of the plurality of vacuum holes. A water separator or the like may be used to this end.

As shown in block 924, the method 900 may include releasing suction applied to the wafer, e.g., to facilitate removal of the wafer from the wafer chuck.

As shown in block 926, the method 900 may include removing the wafer from the wafer chuck.

The method 900 may also or instead include performing a "blow-off" operation on a wafer chuck before placing a new wafer to be inspected thereon, e.g., to remove any water on the surface of the wafer chuck. The method 900 may also or instead include placing the wafer chuck in a scanning acoustic microscope and removing the wafer chuck from the scanning acoustic microscope—e.g., replacing one wafer chuck for another wafer chuck.

The above systems, devices, methods, processes, and the like may be realized in hardware, software, or any combination of these suitable for a particular application. The hardware may include a general-purpose computer and/or dedicated computing device. This includes realization in one or more microprocessors, microcontrollers, embedded microcontrollers, programmable digital signal processors or other programmable devices or processing circuitry, along with internal and/or external memory. This may also, or instead, include one or more application specific integrated circuits, programmable gate arrays, programmable array logic components, or any other device or devices that may be configured to process electronic signals. It will further be appreciated that a realization of the processes or devices described above may include computer-executable code created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software. In another implementation, the methods may be embodied in systems that perform the steps thereof, and may be distributed across devices in a number of ways. At the same time, processing may be distributed across devices such as the various systems described above, or all of the functionality may be integrated into a dedicated, standalone device or other hardware. In another implementation, means for performing the steps associated with the processes described above may include any of the hardware and/or software described above. All such permutations and combinations are intended to fall within the scope of the present disclosure.

Embodiments disclosed herein may include computer program products comprising computer-executable code or computer-usable code that, when executing on one or more computing devices, performs any and/or all of the steps thereof. The code may be stored in a non-transitory fashion in a computer memory, which may be a memory from which the program executes (such as random-access memory associated with a processor), or a storage device such as a disk drive, flash memory or any other optical, electromagnetic, magnetic, infrared or other device or combination of devices. In another implementation, any of the systems and methods described above may be embodied in any suitable transmission or propagation medium carrying computer-executable code and/or any inputs or outputs from same.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So, for example performing the step of X includes any suitable method for causing another party such as a remote user, a remote processing resource (e.g., a server or cloud computer) or a machine to perform the step of X. Similarly, performing steps X, Y, and Z may include any method of directing or controlling any combination of such other individuals or resources to perform steps X, Y, and Z to obtain the benefit of such steps. Thus, method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A wafer chuck, comprising:
   a support structure having a first side structurally configured to support a wafer;
   a first vacuum zone formed on the first side of the support structure, the first vacuum zone at least partially bounded by a first ring extending from a first recessed surface of the first side of the support structure;
   a plurality of first suction cups disposed within the first vacuum zone where one or more of the first suction cups is coupled with an associated channel extending through the support structure;
   a second vacuum zone formed on the first side of the support structure, the second vacuum zone at least partially bounded by a second ring extending from a second recessed surface of the first side of the support structure, where the second ring has a larger diameter than the first ring;
   a plurality of second suction cups disposed within the second vacuum zone where one or more of the second suction cups is coupled with an associated channel extending through the support structure; and
   one or more vacuums in fluid communication with each channel, the one or more vacuums structurally configured to provide suction through each channel.

2. The wafer chuck of claim 1, further comprising a plurality of vacuum holes disposed in the first vacuum zone and the second vacuum zone and extending through the support structure, the one or more vacuums in fluid communication with the plurality of vacuum holes and structurally configured to provide suction through the plurality of vacuum holes.

3. The wafer chuck of claim 2, where the one or more vacuums comprise:
   a first vacuum in fluid communication with a plurality of vacuum holes; and
   a second vacuum in fluid communication with the channel.

4. The wafer chuck of claim 2, where a single vacuum is in fluid communication with each of a plurality of vacuum holes and the channel.

5. The wafer chuck of claim 1, where a contact surface of one or more of the plurality of suction cups protrudes at least a first height H1 above a z-axis height of the ring such that a wafer placed onto the support structure initially rests on the one or more of the plurality of suction cups before suction is provided by the one or more vacuums.

6. The wafer chuck of claim 5, where, when suction is applied to the wafer by the one or more vacuums, the wafer contacts each of the plurality of suction cups and the ring thereby pulling the wafer and mitigating warping thereof.

7. The wafer chuck of claim 6, where the wafer contacting each of the plurality of suction cups and the ring forms a seal in the vacuum zone.

8. The wafer chuck of claim 7, further comprising a plurality of vacuum holes disposed in the vacuum zone and extending through the support structure, the one or more vacuums in fluid communication with the plurality of vacuum holes and structurally configured to provide suction through the plurality of vacuum holes to secure the wafer and maintain the seal, where the one or more vacuums are structurally configured to apply suction through the plurality of vacuum holes to further pull the wafer and further mitigate warping thereof.

9. The wafer chuck of claim 1, further comprising a plurality of vacuum holes disposed in each of the first vacuum zone and the second vacuum zone, the plurality of vacuum holes extending through the support structure, the one or more vacuums in fluid communication with the plurality of vacuum holes.

10. The wafer chuck of claim 9, where the one or more vacuums comprise:
    a first vacuum in fluid communication with the plurality of vacuum holes disposed in the first vacuum zone and the plurality of suction cups disposed in the first vacuum zone; and
    a second vacuum in fluid communication with the plurality of vacuum holes disposed in the second vacuum zone and the plurality of suction cups disposed in the second vacuum zone.

11. The wafer chuck of claim 9, where the one or more vacuums comprise:
    a first vacuum in fluid communication with the plurality of vacuum holes disposed in both the first vacuum zone and the second vacuum zone; and
    a second vacuum in fluid communication with the plurality of suction cups disposed in both the first vacuum zone and the second vacuum zone.

12. The wafer chuck of claim 9, where a single vacuum is in fluid communication with each of the plurality of vacuum holes and the plurality of suction cups in both the first vacuum zone and the second vacuum zone.

13. The wafer chuck of claim 1, where one or more of the first ring and the second ring is sized and shaped to conform with predetermined wafer sizes, and where the first ring has a first contact surface and the second ring has a second contact surface, where the first contact surface and the second contact surface are substantially coplanar.

14. The wafer chuck of claim 1, where a contact surface of one or more of the plurality of suction cups protrudes at least a first height H1 above a z-axis height of both the first ring and the second ring.

15. The wafer chuck of claim 1, further comprising a controller in communication with the one or more vacuums, the controller structurally configured to control suction in the vacuum zone.

16. The wafer chuck of claim 1, further comprising a plurality of posts disposed in the vacuum zone, the plurality of posts structurally configured to maintain a predetermined flatness of the wafer when suction is applied to the wafer, where a number and a size of the plurality of posts are selected to minimize a surface area contacting the wafer while providing a predetermined support thereto.

17. The wafer chuck of claim 1, where each of the plurality of suction cups includes a stem connected to a contact surface, the contact surface structurally configured to support the wafer.

18. The wafer chuck of claim 17, where a height of one or more of the plurality of suction cups is adjustable via movement of the stem along a z-axis.

19. The wafer chuck of claim 17, where the channel is disposed through the stem and the contact surface of the one or more of the plurality of suction cups.

20. The wafer chuck of claim 1, where each of the plurality of suction cups is disposed within a standoff, where a height of the standoff corresponds to a z-axis height of a contact surface of the ring, and where the channel is disposed within the standoff that contains the one or more of the plurality of suction cups.

21. A method, comprising:
receiving a wafer on a first side of a wafer chuck;
applying suction to a first vacuum zone using a first set of suction cups; and
applying suction to a second vacuum zone using a second set of suction cups, such that the wafer contacts one or more of the plurality of suction cups and a first ring at least partially bounding the first a vacuum zone or a second ring at least partially bounding the second vacuum zone thereby mitigating a warping of the wafer.

22. The method of claim 21, further comprising applying a second suction to the wafer through a plurality of vacuum holes thereby pulling the wafer toward a recessed surface of the wafer chuck and further mitigating the warping thereof.

23. The method of claim 22, further comprising controlling one or more of the first suction and the second suction and maintaining a predetermined flatness of the wafer.

24. The method of claim 21, further comprising inspecting the wafer using a scanning acoustic microscope.

* * * * *